(12) United States Patent
Schroeck

(10) Patent No.: US 10,988,856 B2
(45) Date of Patent: Apr. 27, 2021

(54) METHOD FOR PULLING A SINGLE CRYSTAL BY THE FZ METHOD COMPRISING REDUCING THE POWER OF A MELTING APPARATUS BASED ON GEOMETRICAL DIMENSIONS OF THE DROP

(71) Applicant: SILTRONIC AG, Munich (DE)

(72) Inventor: Thomas Schroeck, Kastl (DE)

(73) Assignee: Siltronic AG, Munich (DE)

( * ) Notice: Subject to any disclaimer, the term of this patent is extended or adjusted under 35 U.S.C. 154(b) by 31 days.

(21) Appl. No.: 16/473,401

(22) PCT Filed: Feb. 13, 2018

(86) PCT No.: PCT/EP2018/053481
§ 371 (c)(1),
(2) Date: Jun. 25, 2019

(87) PCT Pub. No.: WO2018/149798
PCT Pub. Date: Aug. 23, 2018

(65) Prior Publication Data
US 2020/0149183 A1    May 14, 2020

(30) Foreign Application Priority Data

Feb. 15, 2017 (DE) ..................... 10 2017 202 420.8

(51) Int. Cl.
*C30B 13/20* (2006.01)
*C30B 13/30* (2006.01)
*C30B 29/06* (2006.01)

(52) U.S. Cl.
CPC .............. *C30B 13/20* (2013.01); *C30B 13/30* (2013.01); *C30B 29/06* (2013.01)

(58) Field of Classification Search
CPC ......... C30B 13/00; C30B 13/16; C30B 13/20; C30B 13/28; C30B 13/30; C30B 15/00;
(Continued)

(56) References Cited

U.S. PATENT DOCUMENTS

2010/0107968 A1  5/2010  Vaabengaard et al.
2011/0107960 A1  5/2011  von Ammon et al.

FOREIGN PATENT DOCUMENTS

CN   101525764 A   9/2009
CN   101680108 A   3/2010
(Continued)

*Primary Examiner* — Kenneth A Bratland, Jr.
(74) *Attorney, Agent, or Firm* — Brooks Kushman P.C.

(57) ABSTRACT

A single crystal is pulled by an FZ method, in which a polycrystal is melted by means of an electromagnetic melting apparatus and then recrystallized, wherein a first phase ($P_1$) a lower end of the polycrystal, which is moved toward the melting apparatus, is melted by the melting apparatus to form a drop, and in a second phase ($P_2$) a monocrystalline seed is attached to the lower end of the polycrystal and is melted beginning from an upper end of the seed, where a power (P) of the melting apparatus during the first phase ($P_1$) and during the second phase ($P_2$) is predetermined at least temporarily in dependence on a temperature and/or geometrical dimensions of crystal material used which comprises the drop and/or the seed and/or the polycrystal.

10 Claims, 5 Drawing Sheets

(58) Field of Classification Search
CPC ......... C30B 15/30; C30B 15/36; C30B 29/00;
C30B 29/02; C30B 29/06
USPC .......... 117/11, 37–39, 49–52, 200, 206, 208,
117/928, 931, 933
See application file for complete search history.

(56) References Cited

FOREIGN PATENT DOCUMENTS

| | | |
|---|---|---|
| CN | 102061512 A | 5/2011 |
| CN | 102220629 A1 | 10/2011 |
| CN | 103436951 | 12/2013 |
| DE | 102010040464 A1 | 3/2012 |
| DE | 102012022965 | 5/2014 |
| JP | 11189486 A | 7/1999 |
| JP | 2000-44380 A | 2/2000 |
| JP | 4016363 B2 | 9/2007 |
| JP | 2010-076979 A | 4/2010 |
| JP | 2011-37640 A | 2/2011 |
| JP | 2013249220 A | 12/2013 |
| JP | 2016-023099 A | 2/2016 |
| WO | 2014033212 A1 | 3/2014 |
| WO | WO-2014033212 A1 * | 3/2014 ........... G05B 13/048 |
| WO | 2014075650 A1 | 5/2014 |

* cited by examiner

METHOD FOR PULLING A SINGLE CRYSTAL BY THE FZ METHOD COMPRISING REDUCING THE POWER OF A MELTING APPARATUS BASED ON GEOMETRICAL DIMENSIONS OF THE DROP

CROSS REFERENCE TO RELATED APPLICATIONS

This application is the U.S. National Phase of PCT Appln. No. PCT/EP2018/053481 filed Feb. 13, 2018, which claims priority to German Application No. 10 2017 202 420.8 filed Feb. 15, 2017, the disclosures of which are incorporated in their entirety by reference herein.

BACKGROUND OF THE INVENTION

1. Field of the Invention

The present invention relates to a method for pulling a single crystal by the FZ method, in which a polycrystal is melted by means of electromagnetic melting and then recrystallized, and also to a corresponding plant.

2. Description of the Related Art

In the pulling of single crystals, particularly those of semiconductor material by the FZ method, the so-called floating zone method or zone melting method, it is possible to generate single crystals of high purity. In this method, a polycrystal, in other words more particularly a crystal made of polycrystalline semiconductor material, is melted and then recrystallized.

In such a process, there are different phases that can be distinguished, as they are described in WO 2014/033212 A1, for example. The polycrystal in this case is first of all melted and then recrystallized on a monocrystalline seed.

At the beginning of crystal "pulling," the diameter of the monocrystal to be fabricated is reduced from approximately the diameter of the seed, to what is called a thin neck section, and is subsequently widened to a desired diameter in a conical section. The diameter can then be kept constant in order to give, for example, a monocrystal in rod form.

Known from JP 4 016 363 B2, for example, is an FZ method wherein four different cameras are used to record different regions of the polycrystal, of the seed attached thereto, and of the liquid or molten material located between them. From these recordings, determinations are then made not only of diameters of the polycrystal and of the monocrystal but also of a height of the region or the zone of the liquid or molten material, referred to as the zone height.

In a method of this kind, and especially for forming what is called the thin neck section, it is desirable to melt a very well-defined volume of material at the lower end of the polycrystal, which is then present in the form of a drop and/or which hangs at the lower end of the polycrystal, before subsequently causing a suitably shaped region to crystallize, this region then being followed by the aforementioned thin neck section.

Against this background, therefore, the object is that of providing an easy and/or precise means of forming a drop of liquid material with defined volume on the polycrystal in order thus in particular to allow the operation to be automated.

SUMMARY OF THE INVENTION

The invention is directed to a method and a plant for pulling a single crystal, wherein the power of the melting apparatus is predetermined for a first phase in which a molten drop is formed and contacted with the seed crystal, and the power is then changed based on a predefined geometric shape as defined herein.

DETAILED DESCRIPTION OF THE PREFERRED EMBODIMENTS

Figure 1:
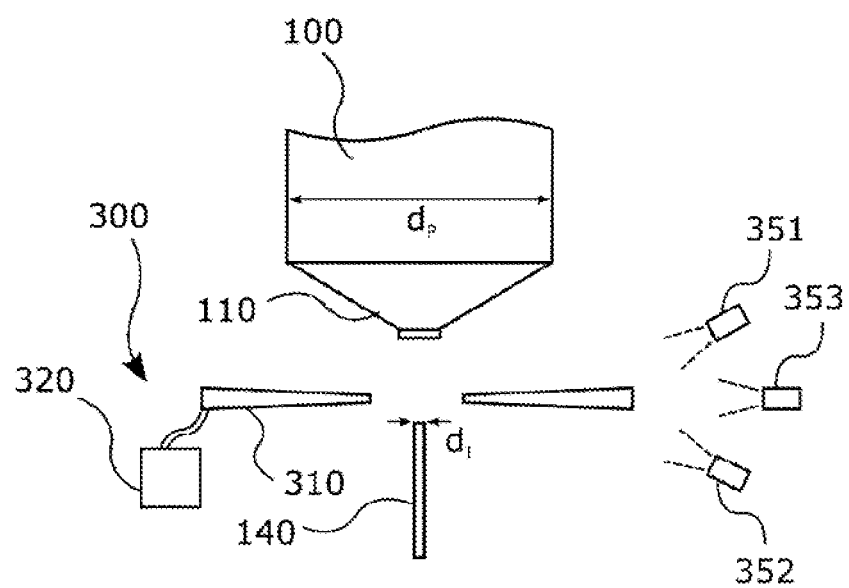
FIG. 1 shows, schematically, a polycrystal and a melting apparatus with which a method of the invention can be implemented.

The starting point for the invention is a method for pulling a single crystal by the FZ method, in which a polycrystal is melted by means of an electromagnetic melting apparatus and then recrystallized. Material eligible for the polycrystal and hence also for the monocrystal to be fabricated here is, in particular, a semiconductor material, preferably silicon. It will be understood that the material may also include certain impurities or dopants.

In a first phase, the polycrystal, which as a general rule is in the form of a rod having a diameter of 160 mm, for example, is first melted by means of a melting apparatus, beginning at a lower (in relation to gravity in the case of vertical disposition of the rod-shaped polycrystal) end. A melting apparatus contemplated here in particular is an inductor or an induction coil. In this case, by means of radiofrequency excitation, electromagnetic energy can be coupled into the polycrystal, which is brought into the vicinity of the inductor.

In the aforementioned first phase, the polycrystal, which as a general rule is conical at its lower end, optionally with a shallow lower section, can be lowered and brought to a central hole in the inductor. In order to maximize the amount of electromagnetic energy coupled into the polycrystal, it is useful to bring the lower end of the polycrystal up to the edge of the hole. The polycrystal then begins to melt at the lower end, with the formation initially of a drop of liquid material hanging from the polycrystal.

Then, in a second phase, a monocrystalline seed, which in particular is likewise rod-shaped and has a diameter of around 4 to 7 mm, for example, is attached to the lower end of the polycrystal and hence to the drop of liquid material, and is then melted, beginning from an upper end of the seed. The melting of the seed generally begins only after the temperature of the seed has adjusted itself to that of the material that is already liquid. The seed may usefully be melted over a certain region of its length, a length which may be, for example, between 5 and 20 mm. It will be understood, however, that a certain region at its lower end is not melted, since this is required for fixing in a pulling apparatus. For the melting of the seed, the seed and the polycrystal are moved upward. This means, for example, that the seed is moved in the direction of the hole in the inductor. In this procedure, a preliminary seed is formed at the lower end of the polycrystal. A preliminary seed in this context is a region, more particularly in the form of a plug, at the lower end of the polycrystal, on which the seed is then attached.

In particular, in a third phase, between a lower section of the seed (at which the seed may be held, for example, in the aforementioned pulling apparatus) and the polycrystal (that is, the portion of the polycrystal which is still solid and has not yet melted), a thin neck section can further be formed whose diameter is smaller than that of the seed. This thin neck section is formed in order to remove any dislocations which form, for example, as a result of the attaching of the seed to the liquid material on the polycrystal. The diameter of the thin neck section here may amount for example to between 2 and 4 mm. In order to form this thin neck section, the seed and the polycrystal, after the seed has been melted as desired, can be moved downward again. By now increasing the lowering velocity of the seed, there is a decrease in the diameter of the zone of liquid material, or of the material which then crystallizes, owing to the conservation of mass.

After the thin neck section, the diameter of the monocrystal can then be increased to a desired diameter of, for example, around 200 mm, and then retained.

Moreover, in particular in a fourth phase in the context of the FZ method, a conical section can then be formed between the thin neck section and the polycrystal. A conical section of this kind serves to widen the diameter from that of the thin neck section to a desired diameter. Moreover, it is then as a rule necessary for a lowering rate of the seed (together with the material already crystallized thereon) and of the polycrystal to be altered in order to increase the diameter. In particular, a reduction in the lowering speed means that a greater amount of material is able to crystallize, hence increasing the diameter.

In accordance with the invention, then, a power of the melting apparatus, beginning in the first phase, is predetermined at least temporarily in dependence on a temperature and/or geometrical dimensions of crystal material used which comprises the drop and/or the seed and/or the polycrystal. Whereas the geometrical dimensions can be captured, for example, directly by means of a camera, which may be disposed in particular above the melting apparatus, the temperature can be determined by using the aforementioned camera, for example, to capture a brightness and/or a spectrum of the material. The brightness here is a measure of the temperature. While a melting rate can be adjusted from the temperature of the material, the shape and hence the volume of the drop can be deduced from the geometrical dimensions. Accordingly, the power of the melting apparatus can therefore be predetermined very easily and very accurately.

It is therefore useful to raise the power of the melting apparatus before attainment of a predefined temperature of the polycrystal, at a first timepoint, and to keep it constant following attainment of the predefined temperature of the polycrystal, in order thus to set a defined temperature of the polycrystal. Shortly after use of the constant power, it is possible with preference for this power to then be raised further, in accordance with a target curve, for example, in order to melt the polycrystal further. The value of the power kept constant may also be stored, to be provided later on as a reference value, on the basis of which the power can be adapted and thus the temperature of the polycrystal can be changed in a targeted way.

It is preferred here if the power of the melting apparatus is reduced, after attainment of predefined geometrical dimensions of the drop, at a second timepoint. The predefined geometrical dimensions may usefully be predetermined on the basis of a geometrical form which fits into a form of the drop, more particularly an equilateral triangle. It is conceivable here, for example, for the lowest point of the drop, in other words the point which is the furthest removed from the still solid polycrystal, to be used as the vertex of the equilateral triangle, while the phase boundary between liquid and solid material is used as the base. Such fitting can be operated very easily using suitable image processing. The dimensions of the triangle in turn represent a suitable measure of the volume of the drop. Hence it is ensured that the drop does not become too large and is able to part from the polycrystal.

After the seed has been contacted with the drop, it is advantageous if the power of the melting device, after attainment of a predefined temperature of the seed, is reduced at a third time point. It can then be assumed, indeed, that the seed, after contacting, is sufficiently incandescent. The temperature of the seed is determined advantageously with the aid of a camera which is disposed below the melting apparatus.

The adaptations in power that are to be implemented at the aforementioned timepoints are usefully accomplished in the order stated; in other words, the second timepoint lies after the first timepoint and before the third timepoint.

A further subject of the invention is a plant which is equipped for implementing the method of the invention. The plant for this purpose may comprise in particular a melting apparatus, of the kind already mentioned multiple times, for example, and also a suitable arithmetic unit. The arithmetic unit may then be equipped accordingly to implement the individual method steps and also, for example, to drive the cameras accordingly and evaluate their images.

In order to avoid repetition, reference may otherwise be made to the above elucidations concerning the method of the invention, with regard to further embodiments and also to the advantages of the plant.

Further advantages and embodiments of the invention will be apparent from the description and the appended drawing.

It will be appreciated that the features identified above and those still to be elucidated hereinafter can be used not only in the particular combination indicated but also in other combinations, or on their own, without departing from the scope of the present invention.

The invention is illustrated schematically in the drawing by an exemplary embodiment, and is described below with reference to the drawing.

Illustrated in a side view in FIG. 1, schematically are a polycrystal 100 and a melting apparatus 300 with which a method of the invention can be implemented. The melting apparatus 300 here has an inductor or an induction coil 310, which can be driven or operated correspondingly with radiofrequency, for example, by means of a drive unit 320 which is connected via corresponding lines.

This melting apparatus 300 may in this case be part of a plant which is equipped for the pulling of a single crystal. A plant of this kind may then also have corresponding holding devices for the inductor 300, the single crystal 100, and the cameras 351, 352 and 353. Furthermore, a plant of this kind may have an arithmetic unit for controlling the other constituents.

The polycrystal 100, which in particular may comprise or consist of silicon, is designed to be predominantly rod-shaped or cylindrical. In the rod-shaped or cylindrical region, of which only part is shown here, the polycrystal 100 has a diameter $d_P$ which may be, for example, 160 mm. At its lower end, however, the polycrystal 100 is conical in shape, thus having a conical section 110. It can be seen, furthermore, that the conical section 110 in turn may have a shallow end at its lower end.

If the polycrystal has not been machined, but instead comes, for example, from a melting operation not completed, this lower end may thus also have a different form. Furthermore, a seed 140 can be seen which has a diameter $d_I$ which may be, for example, 4 to 7 mm. The seed is a monocrystal which may likewise be rod-shaped or cylindrical in form.

Figure 2:
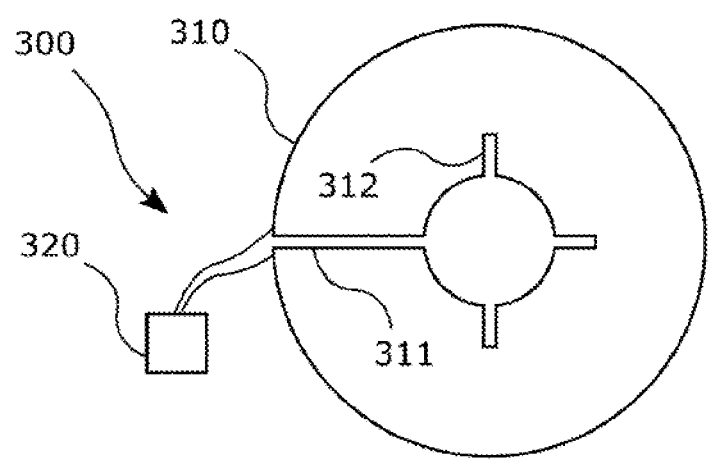
FIG. 2 shows the melting apparatus from FIG. 1 in a different view.

Illustrated in FIG. 2 is the melting apparatus 300 from FIG. 1 in a different view, in this case a plan view, albeit without the polycrystal 100. Clearly visible here, then, is a recess or a hole in the middle of the inductor 310, through which the polycrystal is guided—during the melting operation and then in the liquefied state.

Visible in particular here, then, is a primary slot 311 and also three ancillary slots 312, which are advantageous for the function of the melting apparatus, more particularly for the generation of the electromagnetic energy. As can be seen, the inductor is not closed, because of the primary slot 311.

FIGS. 3a to 3f then show, schematically, different phases of a method of the invention in one preferred embodiment. The process of the method will be elucidated in more detail below with reference to FIGS. 3a to 3f and also to FIGS. 4a and 4b, which show the rates $v_P$ of the polycrystal and vi of the seed and a power P of the melting apparatus in individual phases over the time t.

In a first phase $P_1$ the polycrystal 100 is first brought up to the inductor 310 or the recess in its center. For this purpose, for example, the polycrystal is lowered at a constant rate. The seed 140 here need not as yet be moved. Contrary to the orientation shown here, the polycrystal 100 may also be brought closer to an inner edge of the inductor 310, in order to allow more effective coupling of the electromagnetic energy into the polycrystal 100.

Figure 3A:
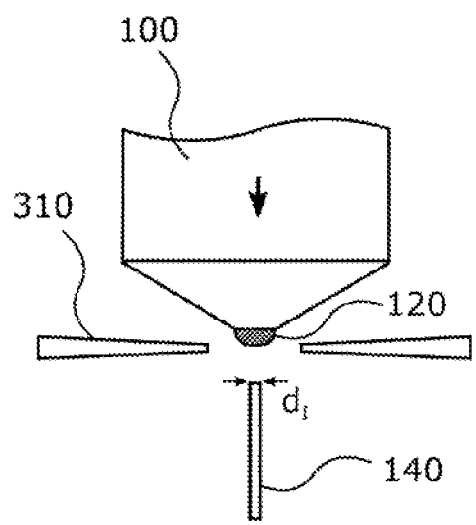
FIGS. 3a to 3f show, schematically, different phases of a method of the invention in one preferred embodiment.
Figure 4A:
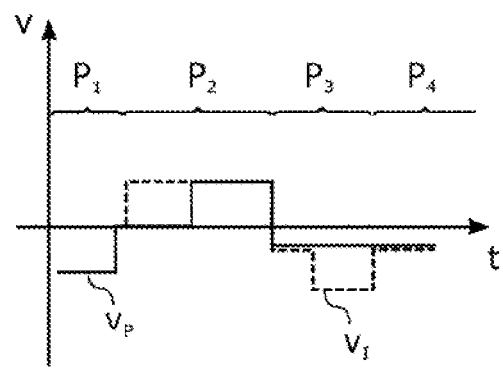
FIGS. 4a and 4b show a temporal sequence of a method of the invention in one preferred embodiment.

The polycrystal 100 thus begins to melt at its lower end, hence including the lower end of the conical section. In this case, a drop 120 of liquid material which hangs from the polycrystal is formed, as can be seen in FIG. 3a. Here and in the following figures, liquid material is shown with hatching, whereas solid material is shown white or without hatching.

Figure 4B:
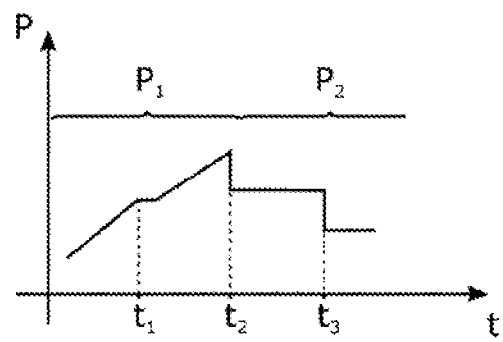

A power P of the melting apparatus 300 is initially increased in this case and, after attainment of a predefined temperature of the polycrystal 100, designated timepoint $t_1$ in FIG. 4b, is kept constant. The power can then be increased again.

However, as soon as the drop 120 has attained a predefined form, this being designated with the timepoint $t_2$ in FIG. 4b, the power is reduced again. In this way it is achieved that the drop does not become too large and part from the polycrystal. The form may be recognized from geometrical dimensions.

Figure 5:
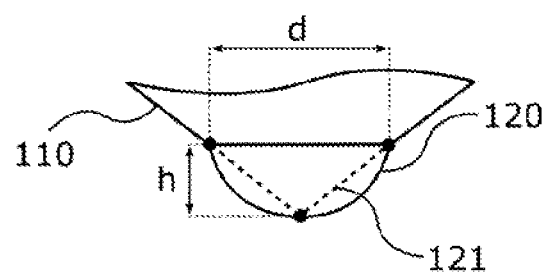
FIG. 5 shows a detailed view of a lower end of the polycrystal from FIG. 1.

For this purpose, in FIG. 5, by way of example, a diameter d of the drop 120 on the phase boundary to the conical section 110, and also a height h, as the distance of the lowest (in the figure) point of the drop over the phase boundary are shown. In this regard it is noted that the drop 120 of liquid material—in contrast to the other figures and for the sake of good comprehension—is shown without hatching.

In an image captured by the corresponding camera, it is possible here, by means of suitable image processing, for example, to fit an equilateral triangle 121 with the corner points shown, the dimensions of said triangle on the one hand representing the aforementioned geometrical dimensions of the drop and on the other hand also constituting a measure of the volume of the drop.

Figure 3B:
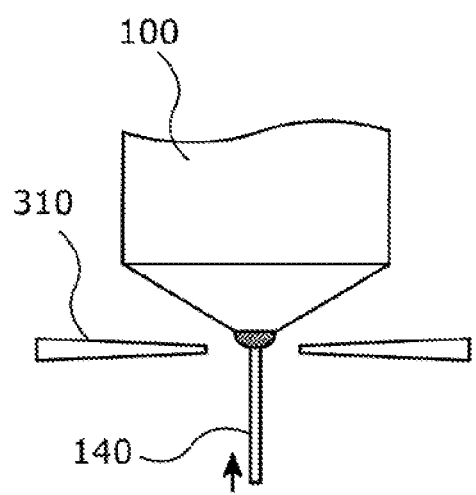

In a second phase $P_2$, the seed 140 is then attached to the lower end of the polycrystal 100 and hence to the drop 120 of liquid material, as can be seen in FIG. 3b, and is melted beginning from an upper end of the seed 140. For this purpose, the seed is first of all moved toward the polycrystal 100, in other words upward, at a defined rate, for example, while the polycrystal 100 may be at rest. The melting of the seed 140 in this case generally begins only after the temperature of the seed 140 has equalized with that of the already liquid material.

For this purpose, as can be seen in FIG. 4b starting from timepoint $t_3$, the power of the melting apparatus can now be reduced again as soon as the seed 140 is sufficiently incandescent. This can be recognized from the temperature of the seed. In this context, the brightness of the solid material of the seed, and/or the spectrum, are a preferred measure of the temperature.

Figure 3C:
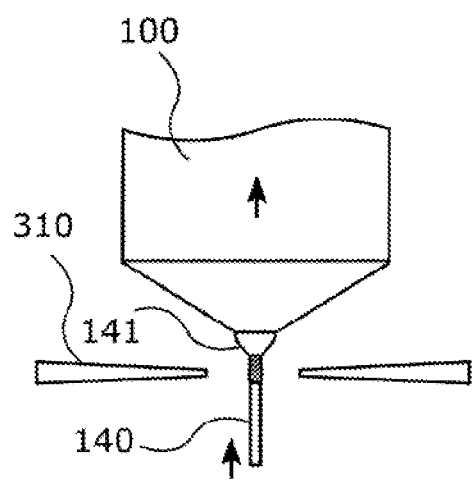

When the seed 140 is attached to the drop of liquid material at the lower end of the polycrystal 100 and has melted with it, the polycrystal 100 and the seed 140 are jointly moved upward, as can be seen in FIG. 3c. In this case the preliminary seed 141 is also formed at the lower end of the polycrystal 100. The seed may then be melted over a certain region of its length, between 5 and 20 mm, for example, by the seed being moved in the direction of the hole in the inductor 310.

It will be understood, however, that a certain region at the lower end of the seed 140 will not be melted, since this section is needed for fastening in a pulling apparatus (as part of the aforementioned plant).

In a third phase $P_3$, then, between a lower section of the seed 140 and the polycrystal 100 (that is, the portion of the polycrystal that is still solid and has not yet melted), a thin neck section 130 is formed whose diameter do, at 2 to 4 mm, for example, is smaller than that of the seed 140. For this purpose, the polycrystal 100 and the seed 140 are first of all moved downward simultaneously, i.e., at the same rate.

Figure 3D:
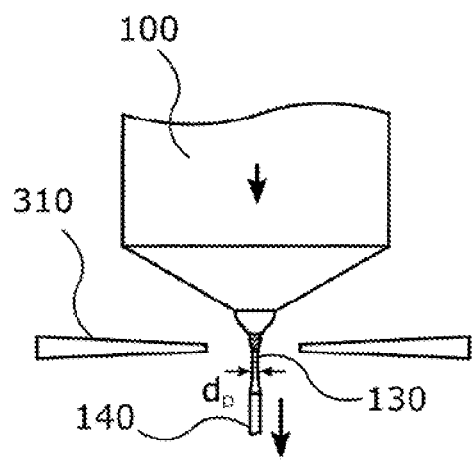

The lowering rate of the seed 140 is then increased at a certain time point relative to that of the polycrystal 100. Therefore, the diameter of the zone of liquid material or of the material which then crystallizes is reduced, owing to the conservation of mass. In FIG. 3d, for example, a thin neck section 130 having a certain length is already formed.

Figure 3E:
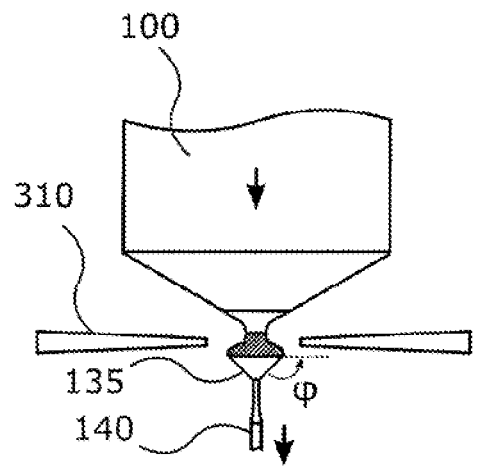
Figure 3F:
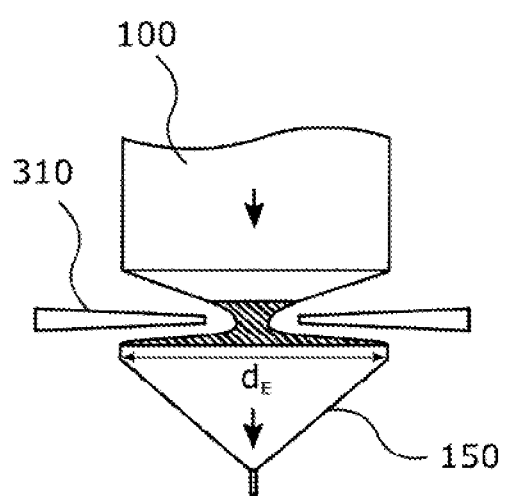

In a fourth phase $P_4$, it is then possible, between the thin neck section and the polycrystal 100, for a conical section 135 with an angle φ of inclination to form, as can be seen in FIG. 3e. A conical section 135 of this kind serves to widen the diameter from that of the thin neck section to a desired diameter dE of, for example, 200 mm of the monocrystal 150 to be fabricated, as can be seen in FIG. 3f.

The invention claimed is:

1. A method for pulling a single crystal by the FZ method by melting a polycrystal by means of an electromagnetic melting apparatus and then recrystallizing the polycrystal, comprising:

in a first phase ($P_1$), moving the polycrystal toward the melting apparatus and melting a lower end of the polycrystal by means of the melting apparatus to form a drop;

in a second phase ($P_2$), attaching a monocrystalline seed to the drop at a lower end of the polycrystal, and melting the monocrystalline seed beginning from an upper end of the seed;

predetermining during the first phase ($P_1$) and during the second phase ($P_2$), at least temporarily, a power (P) of the melting apparatus in dependence on a temperature and/or geometrical dimensions (d, h) of crystal material used, which comprises the drop and/or the seed and/or the polycrystal;

during the first phase ($P_1$), reducing the power (P) of the melting apparatus after attainment of predefined geometrical dimensions (h, d) of the drop at a timepoint ($t_2$), the predefined geometrical dimensions being predetermined on the basis of an equilateral triangle, which fits into a form of the drop, where the lowest point of the drop is used as the vertex of the equilateral triangle and where the phase boundary between liquid and solid material is used as the base of the equilateral triangle.

2. The method of claim 1, further comprising: during the first phase ($P_1$), increasing the power (P) of the melting apparatus before attainment of a predefined temperature of the polycrystal at a timepoint ($t_1$) and keeping constant the power (P) of the melting apparatus after attainment of the predefined temperature of the polycrystal.

3. The method of claim 2, comprising storing the value of the power which is kept constant.

4. The method of claim 1 further comprising: during the second phase ($P_2$), reducing the power (P) of the melting apparatus after attainment of a predefined temperature of the monocrystalline seed at a timepoint ($t_3$).

5. The method of claim 1 further comprising: determining a temperature of the crystal material used on the basis of a brightness and/or a spectrum of the crystal material used.

6. The method of claim 1 further comprising: determining the temperature and/or the geometrical dimensions of the crystal material used using a camera, which is disposed above the melting apparatus.

7. The method of claim 1, further comprising: determining the temperature of the monocrystalline seed using a camera which is disposed below the melting apparatus.

8. The method of claim 1, further comprising: forming in a third phase ($P_3$), between a lower section of the seed and the polycrystal a thin neck section, whose diameter ($d_D$) is smaller than that ($d_I$) of the seed.

9. The method of claim 1, further comprising: forming in a fourth phase ($P_4$) a conical section of the single crystal between the thin neck section and the polycrystal.

10. A device for the pulling of a single crystal by the FZ method, comprising a melting apparatus, cameras for capturing geometrical dimensions and for determining the temperature and an arithmetic unit having inputs from the cameras and which drives the cameras, evaluates their images, and implements the steps of the method of claim 1 based on the evaluation.

* * * * *